United States Patent
Ina et al.

(10) Patent No.: US 9,685,348 B2
(45) Date of Patent: Jun. 20, 2017

(54) SEMICONDUCTOR DEVICE, METHOD OF MANUFACTURING THE SAME AND POWER CONVERTER

(71) Applicant: TOYODA GOSEI CO., LTD., Kiyosu-shi (JP)

(72) Inventors: Tsutomu Ina, Kiyosu (JP); Tohru Oka, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/055,357

(22) Filed: Feb. 26, 2016

(65) Prior Publication Data

US 2016/0276172 A1 Sep. 22, 2016

(30) Foreign Application Priority Data

Mar. 17, 2015 (JP) ................. 2015-053019

(51) Int. Cl.
*H01L 21/3213* (2006.01)
*H01L 29/45* (2006.01)

(52) U.S. Cl.
CPC ........ *H01L 21/32135* (2013.01); *H01L 29/45* (2013.01)

(58) Field of Classification Search
CPC ........... H01L 21/3213; H01L 21/32135; H01L 21/76822; H01L 21/28575; H01L 21/76843
See application file for complete search history.

(56) References Cited

U.S. PATENT DOCUMENTS

| 5,563,422 | A | 10/1996 | Nakamura et al. |
| 2008/0081534 | A1* | 4/2008 | Oh ..................... H01L 21/02071 445/49 |
| 2010/0035411 | A1* | 2/2010 | Fujikawa ............ H01L 21/0465 438/478 |
| 2010/0265977 | A1* | 10/2010 | Kwon .................... B82Y 20/00 372/45.01 |
| 2011/0068371 | A1* | 3/2011 | Oka ................... H01L 29/66462 257/194 |
| 2012/0049188 | A1* | 3/2012 | Park ..................... H01L 21/3226 257/52 |
| 2014/0120718 | A1* | 5/2014 | Nishi ................ H01L 29/66462 438/666 |

FOREIGN PATENT DOCUMENTS

JP H07-221103 A 8/1995

* cited by examiner

*Primary Examiner* — Phuc Dang
(74) *Attorney, Agent, or Firm* — McGinn IP Law Group, PLLC.

(57) ABSTRACT

An object is to avoid an increase in contact resistance of an ohmic electrode by etching in a semiconductor device. There is provided a method of manufacturing a semiconductor device. The method of manufacturing comprises forming a semiconductor layer; forming an ohmic electrode by stacking a plurality of metal layers, on the semiconductor layer; forming another metal layer that is mainly made of another metal different from a material of an outermost layer among the plurality of metal layers, on the ohmic electrode; removing the another metal layer from top of the ohmic electrode by etching; and processing the ohmic electrode by heat treatment, subsequent to the etching.

13 Claims, 17 Drawing Sheets

US 9,685,348 B2

SEMICONDUCTOR DEVICE, METHOD OF MANUFACTURING THE SAME AND POWER CONVERTER

CROSS REFERENCE TO RELATED APPLICATION

The present application claims the priority based on Japanese Patent Application No. 2015-53019 filed on Mar. 17, 2015, the disclosures of which are hereby incorporated by reference in its entirety.

BACKGROUND

Technical Field

The present invention relates to a semiconductor device, a method of manufacturing the same and a power converter Description of the Related Art A technique of forming an electrode having ohmic properties (ohmic electrode) on a semiconductor layer has been known as the method of manufacturing a semiconductor device (semiconductor element) (for example, JP H07-221103A). In general, the ohmic electrode formed on the semiconductor layer is required to reduce the contact resistance, while ensuring the adhesion to the semiconductor layer.

JP H07-221103A describes stacking a plurality of electrode layers and subsequently processing the stacked electrode layers by heat treatment (annealing process, annealing to form the ohmic electrode.

In the ohmic electrode formed by heat treatment of the plurality of electrode layers, the metals of the respective electrode layers are alloyed by heat treatment. The ohmic electrode is thus unlikely to have sufficient resistance to etching. The technique described in JP H07-221103A has not fully taken into account exposure of the ohmic electrode to etching. The contact resistance of the ohmic electrode to the semiconductor layer is thus likely to increase. There is accordingly a need for a technique that avoids an increase in contact resistance of the ohmic electrode by etching. Other needs with regard to the semiconductor device include cost reduction, miniaturization, easy manufacture, resource saving, improvement of usability and improvement of durability.

SUMMARY

In order to solve at least part of the problems described above, the invention may be implemented by aspects described below.

(1) According to one aspect of the invention, there is provided a method of manufacturing a semiconductor device. The method of manufacturing the semiconductor device of this aspect comprises forming a semiconductor layer, forming an ohmic electrode by stacking a plurality of metal layers, on the semiconductor layer, forming another metal layer that is mainly made of another metal different from a material of an outermost layer among the plurality of metal layers, on the ohmic electrode, removing the another metal layer from top of the ohmic electrode by etching, and processing the ohmic electrode by heat treatment, subsequent to the etching. This aspect performs etching prior to heat treatment to alloy the metals included in the respective metal layers. This can thus avoid an increase in contact resistance of the ohmic electrode by etching.

(2) In the method of manufacturing the semiconductor device according to the above aspect, the removing the another metal layer from top of the ohmic electrode by etching may comprise leaving part of the another metal layer in an area different from top of the ohmic electrode to form another electrode different from the ohmic electrode. This aspect can avoid an increase in contact resistance of the ohmic electrode by etching, while forming another electrode by etching.

(3) In the method of manufacturing the semiconductor device according to the above aspect, the etching may include dry etching. This aspect can avoid increase in contact resistance of the ohmic electrode by dry etching.

(4) In the method of manufacturing the semiconductor device according to the above aspect, the dry etching may use a chlorine-containing gas. This aspect can avoid increase in contact resistance of the ohmic electrode by dry etching using a chlorine-based gas.

(5) In the method of manufacturing the semiconductor device according to the above aspect, the forming the ohmic electrode on the semiconductor layer may comprise forming a metal layer mainly made of at least one metal or alloy selected from the group consisting of titanium (Ti), vanadium (V) and alloys thereof, as a metal layer formed on the semiconductor layer among the plurality of metal layers. This aspect can sufficiently reduce the contact resistance of the ohmic electrode.

(6) In the method of manufacturing the semiconductor device according to the above aspect, the forming the ohmic electrode on the semiconductor layer may comprise forming a metal layer mainly made of aluminum (Al) or an aluminum (Al)-containing alloy, as a metal layer different from the outermost layer among the plurality of metal layers. This aspect can sufficiently reduce the contact resistance of the ohmic electrode.

(7) In the method of manufacturing the semiconductor device according to the above aspect, the forming the ohmic electrode on the semiconductor layer may comprise forming a metal layer mainly made of at least one metal or alloy selected from the group consisting of palladium (Pd), gold (Au), platinum (Pt) and alloys thereof, as the outermost layer. This aspect can enhance the resistance of the outermost layer to etching.

(8) In the method of manufacturing the semiconductor device according to the above aspect, the forming the another metal layer may comprise forming a metal layer mainly made of aluminum (Al) or an aluminum (Al)-containing alloy, as at least part of the another metal layer. This aspect enables the another metal layer to be readily removed in the subsequent process of removing the another metal layer.

(9) In the method of manufacturing the semiconductor device according to the above aspect, the processing the ohmic electrode by heat treatment may comprise processing the ohmic electrode by heat treatment for a time period between 1 minute and 60 minutes, inclusive. This aspect can sufficiently reduce the contact resistance of the ohmic electrode.

(10) In the method of manufacturing the semiconductor device according to the above aspect, the processing the ohmic electrode by heat treatment may comprise processing the ohmic electrode by heat treatment in an atmospheric temperature of between 400° C. and 700° C., inclusive. This aspect can sufficiently reduce the contact resistance of the ohmic electrode.

(11) In the method of manufacturing the semiconductor device according to the above aspect, the processing the ohmic electrode by heat treatment may comprise processing the ohmic electrode by heat treatment using an atmospheric gas mainly made of nitrogen (N$_2$). This aspect can sufficiently reduce the contact resistance of the ohmic electrode.

(12) In the method of manufacturing the semiconductor device according to the above aspect, the semiconductor layer may be mainly made of gallium nitride (GaN). This aspect can avoid an increase in contact resistance of the ohmic electrode by etching in a gallium-nitride-based semiconductor device.

The invention may be implemented by any of various aspects other than the method of manufacturing the semiconductor device described above, for example, a semiconductor device manufactured by the method of manufacturing the semiconductor device according to any of the above aspects, a power converter including the semiconductor device, electric equipment in which the power converter is incorporated and a manufacturing apparatus for manufacturing the semiconductor device.

The above aspect of the invention performs etching prior to heat treatment to alloy the metals included in the respective metal layers. This can thus avoid an increase in contact resistance of the ohmic electrode by etching.

DESCRIPTION OF EMBODIMENTS

A. First Embodiment

A-1. Configuration of Power Converter

Figure 1:
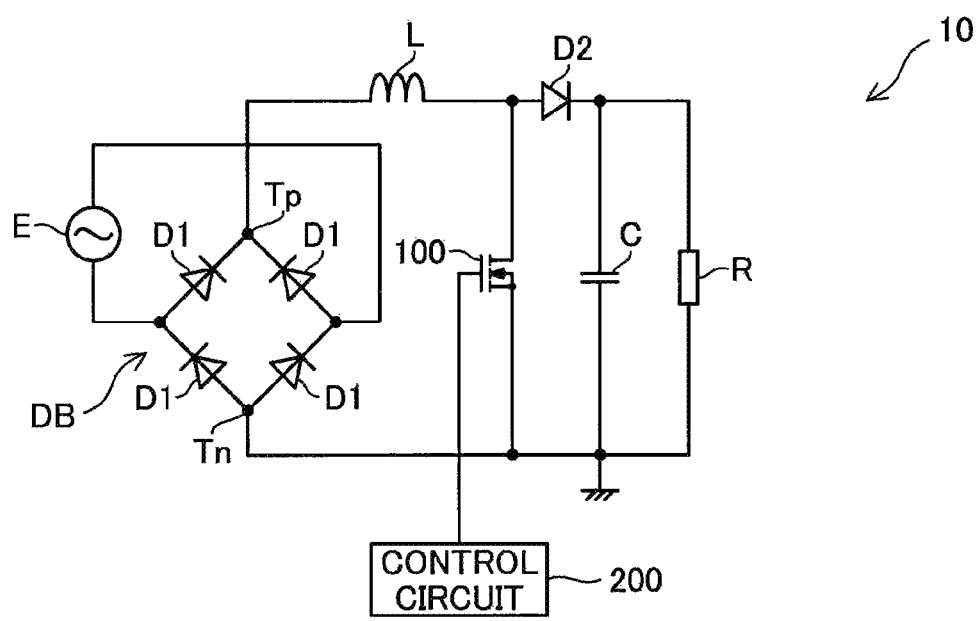
FIG. 1 is a diagram illustrating the configuration of a power converter 10.

FIG. 1 is a diagram illustrating the configuration of a power converter 10. The power converter 10 is an apparatus configured to convert electric power supplied from an AC power source E to a load R. The power converter 10 includes a semiconductor device 100, a control circuit 200, four diodes D1, a coil L, a diode D2 and a capacitor C as components of a power factor correction circuit configured to improve the power factor of the AC power source E.

In the power converter 10, the four diodes D1 constitute a diode bride DB configured to rectify the AC voltage of the AC power source E. The diode bridge DB has a positive electrode output terminal Tp and a negative electrode output terminal Tn as DC-side terminals. The coil L is connected with the positive electrode output terminal Tp of the diode bridge DB. The anode side of the diode D2 is connected with the positive electrode output terminal Tp via the coil L. The cathode side of the diode D2 is connected with the negative electrode output terminal Tn via the capacitor C. The load R is connected in parallel with the capacitor C.

The semiconductor device 100 of the power converter 10 is an FET (field effect transistor). The source side of the semiconductor device 100 is connected with the negative electrode output terminal Tn. The drain side of the semiconductor device 100 is connected with the positive electrode output terminal Tp via the coil L. The gate side of the semiconductor device 100 is connected with the control circuit 200. The control circuit 200 of the power converter 10 controls the electric current between the source and the drain of the semiconductor device 100, based on the voltage output to the load R and the electric current flowing in the diode bridge DB, in order to improve the power factor of the AC power source E.

A-2. Configuration of Semiconductor Device

Figure 2:
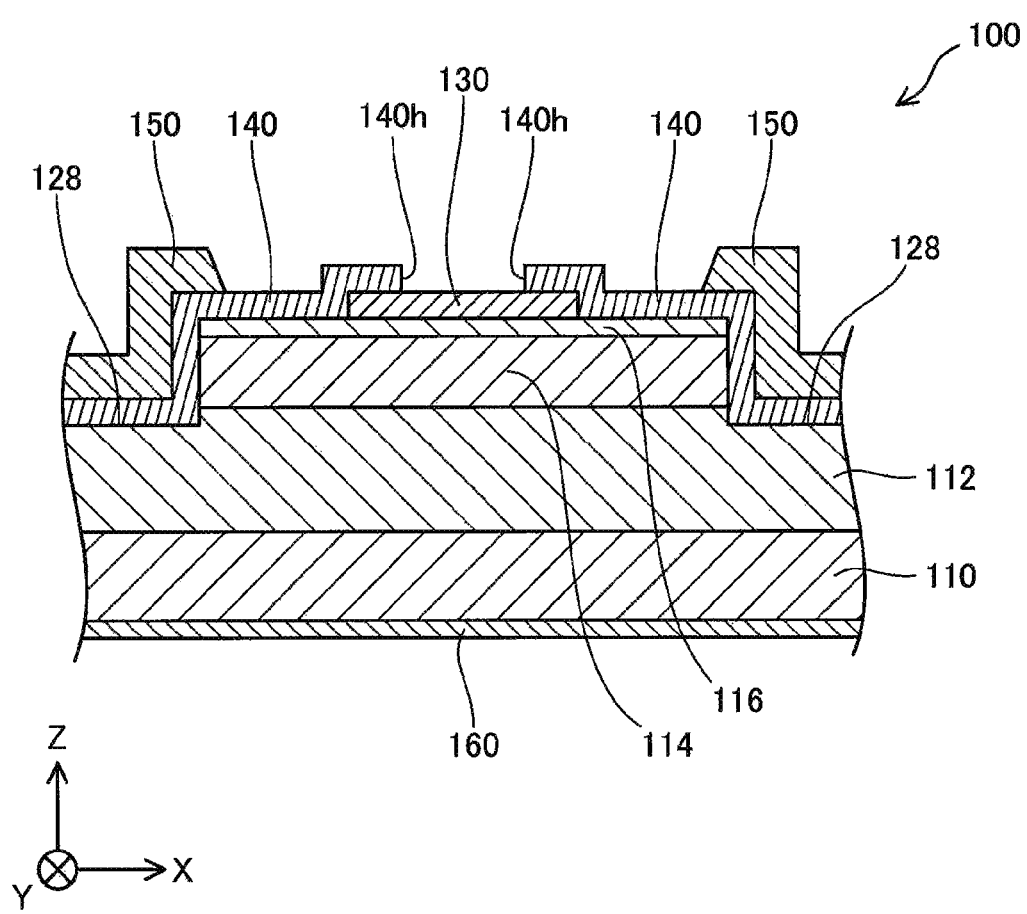
FIG. 2 is a sectional view schematically illustrating the configuration of the semiconductor device 100 according to a first embodiment.

FIG. 2 is a sectional view schematically illustrating the configuration of the semiconductor device 100 according to a first embodiment. XYZ axes orthogonal to one another are illustrated in FIG. 2. Among the XYZ axes of FIG. 2, the X axis denotes a left-right axis on the sheet surface of FIG. 2. +X-axis direction denotes a rightward direction on the sheet surface, and −X-axis direction denotes a leftward direction on the sheet surface. Among the XYZ axes of FIG. 2, the Y axis denotes a front-back axis on the sheet surface of FIG. 2. +Y-axis direction denotes a backward direction on the sheet surface, and −Y-axis direction denotes a forward direction on the sheet surface. Among the XYZ axes of FIG. 2, the Z axis denotes a top-bottom axis on the sheet surface of FIG. 2. +Z-axis direction denotes an upward direction on the sheet surface, and −Z-axis direction denotes a downward direction on the sheet surface. The XYZ axes illustrated in other drawings correspond to the XYZ axes of FIG. 2.

According to this embodiment, the semiconductor device 100 is a GaN-based semiconductor device formed using gallium nitride (GaN). According to this embodiment, the semiconductor device 100 is a vertical trench MOSFET (metal-oxide-semiconductor field effect transistor). According to this embodiment, the semiconductor device 100 is used for power control and is also called power device.

The semiconductor device 100 includes a substrate 110, a semiconductor layer 112, a semiconductor layer 114 and a semiconductor layer 116. The semiconductor device 100 includes trenches 128 as structures formed in these semiconductor layers 112, 114 and 116. The semiconductor device 10 also includes a source electrode 130, an insulating film 140, a gate electrode 150 and a drain electrode 160.

The substrate 110 of the semiconductor device 100 is a plate-like semiconductor extended along the X axis and the Y axis. According to this embodiment, the substrate 110 is mainly made of gallium nitride (GaN). In the description hereof, the expression of "mainly made of gallium nitride (GaN)" means "containing gallium nitride (GaN) at 90% or a higher molar fraction. According to this embodiment, the substrate 110 is an n-type semiconductor containing silicon (Si) as the donor element. According to this embodiment, the average concentration of silicon (Si) contained in the substrate 110 is about $1 \times 10^{18}$ cm$^{-3}$.

The semiconductor layer 112 of the semiconductor device 100 is a first semiconductor layer that is located on the +Z-axis direction side of the substrate 110 and is extended along the X axis and the Y axis. According to this embodiment, the semiconductor layer 112 is mainly made of gallium nitride (GaN). According to this embodiment, the semiconductor layer 112 is an n-type semiconductor having n-type characteristics. According to this embodiment, the semiconductor layer 112 contains silicon (Si) as the donor element. According to this embodiment, the average concentration of silicon (Si) contained in the semiconductor layer 112 is about $1.0 \times 10^{16}$ cm$^{-3}$. According to this embodiment, the thickness (length in the Z-axis direction) of the semiconductor layer 112 is about 10 μm (micrometers). According to this embodiment, the semiconductor layer 112 is a layer formed on the substrate 110 by metal organic chemical vapor deposition (MOCVD).

The semiconductor layer 114 of the semiconductor device 100 is a second semiconductor layer that is located on the +Z-axis direction side of the semiconductor layer 112 and is extended along the X axis and the Y axis. According to this embodiment, the semiconductor layer 114 is mainly made of gallium nitride (GaN). According to this embodiment, the semiconductor layer 114 is a p-type semiconductor having p-type characteristics. According to this embodiment, the semiconductor layer 114 contains magnesium (Mg) as the acceptor element. According to this embodiment, the average concentration of magnesium (Mg) contained in the semiconductor layer 114 is about $1.0 \times 10^{18}$ cm$^{-3}$. According to this embodiment, the thickness (length in the Z-axis direction) of the semiconductor layer 114 is about 1.0 μm. According to this embodiment, the semiconductor layer 114 is a layer formed on the semiconductor layer 112 by metal organic chemical vapor deposition (MOCVD).

The semiconductor layer 116 of the semiconductor device 100 is a third semiconductor layer that is located on the +Z-axis direction side of the semiconductor layer 114 and is extended along the X axis and the Y axis. According to this embodiment, the semiconductor layer 116 is mainly made of gallium nitride (GaN). According to this embodiment, the semiconductor layer 116 is an n-type semiconductor having n-type characteristics. According to this embodiment, the semiconductor layer 116 contains silicon (Si) as the donor element. According to this embodiment, the average concentration of silicon (Si) contained in the semiconductor layer 116 is about $3.0 \times 10^{18}$ cm$^{-3}$. According to this embodiment, the thickness (length in the Z-axis direction) of the semiconductor layer 116 is about 0.3 μm. According to this embodiment, the semiconductor layer 116 is a layer formed on the semiconductor layer 114 by metal organic chemical vapor deposition (MOCVD).

The trench 128 of the semiconductor device 100 is a groove that is formed from the +Z-axis direction side of the semiconductor layer 116 to penetrate through the semiconductor layer 114 and to be recessed into the semiconductor layer 112. According to this embodiment, the trench 128 is a structure formed by dry etching of the semiconductor layers 112, 114 and 116.

The source electrode 130 of the semiconductor device 100 is an ohmic electrode that is in ohmic contact with a +Z-axis direction side surface of the semiconductor layer 116. The outer periphery of the source electrode 130 is covered with the insulating film 140. According to another embodiment, the outer periphery of the source electrode 130 may not be covered with the insulating film 140. According to this embodiment, the source electrode 130 is an electrode formed by stacking a metal layer mainly made of titanium (Ti), a metal layer mainly made of aluminum (Al) and a metal layer mainly made of palladium (Pd) sequentially from the semiconductor layer 116-side and subsequently processing the stacked layers by heat treatment. According to another embodiment, the source electrode 130 may be an electrode formed by stacking a metal layer mainly made of titanium (Ti), a metal layer mainly made of aluminum (Al), a metal layer mainly made of molybdenum (Mo) and a metal layer mainly made of palladium (Pd) sequentially from the semiconductor layer 116-side and subsequently processing the stacked layers by heat treatment.

The insulating film 140 of the semiconductor device 140 is a film having electrical insulating properties. The insulating film 140 is formed to be extended from the trench 128 onto the source electrode 130. According to another embodiment, the insulating film 140 may be formed to be extended from the trench 128 to an outer edge of the source electrode 130. The insulating film 140 has a contact hole 140*h* that is formed inside of the outer edge of the source electrode 130. According to another embodiment, the contact hole 140*h* may be formed outside of the outer edge of the source electrode 130. The contact hole 140*h* is an opening in which the source electrode 130 is exposed on the insulating film 140. According to this embodiment, the insulating film 140 is mainly made of silicon dioxide (SiO$_2$). According to this embodiment, the insulating film 140 is a film formed by atomic layer deposition (ALD).

The gate electrode 150 of the semiconductor device 100 is an electrode formed inside of the trench 128 via the insulating film 140. According to this embodiment, the gate electrode 150 is mainly made of aluminum (Al). According to another embodiment, the gate electrode 150 may be an electrode formed by stacking a metal layer mainly made of titanium nitride (TiN) and a metal layer mainly made of aluminum (Al) sequentially from the insulating film 140-side. When a voltage is applied to the gate electrode 150, an inversion layer is formed in the semiconductor layer 114 to serve as a channel, and a conductive path is formed between the source electrode 130 and the drain electrode 160.

The drain electrode 160 of the semiconductor device 100 is an electrode that is in ohmic contact with a −Z-axis direction side surface of the substrate 110. According to this embodiment, the drain electrode 160 is an electrode formed by stacking a metal layer mainly made of titanium (Ti) and a metal layer mainly made of aluminum (Al) sequentially from the substrate 110-side and subsequently processing the stacked layers by heat treatment.

A-3. Method of Manufacturing Semiconductor Device

Figure 3:
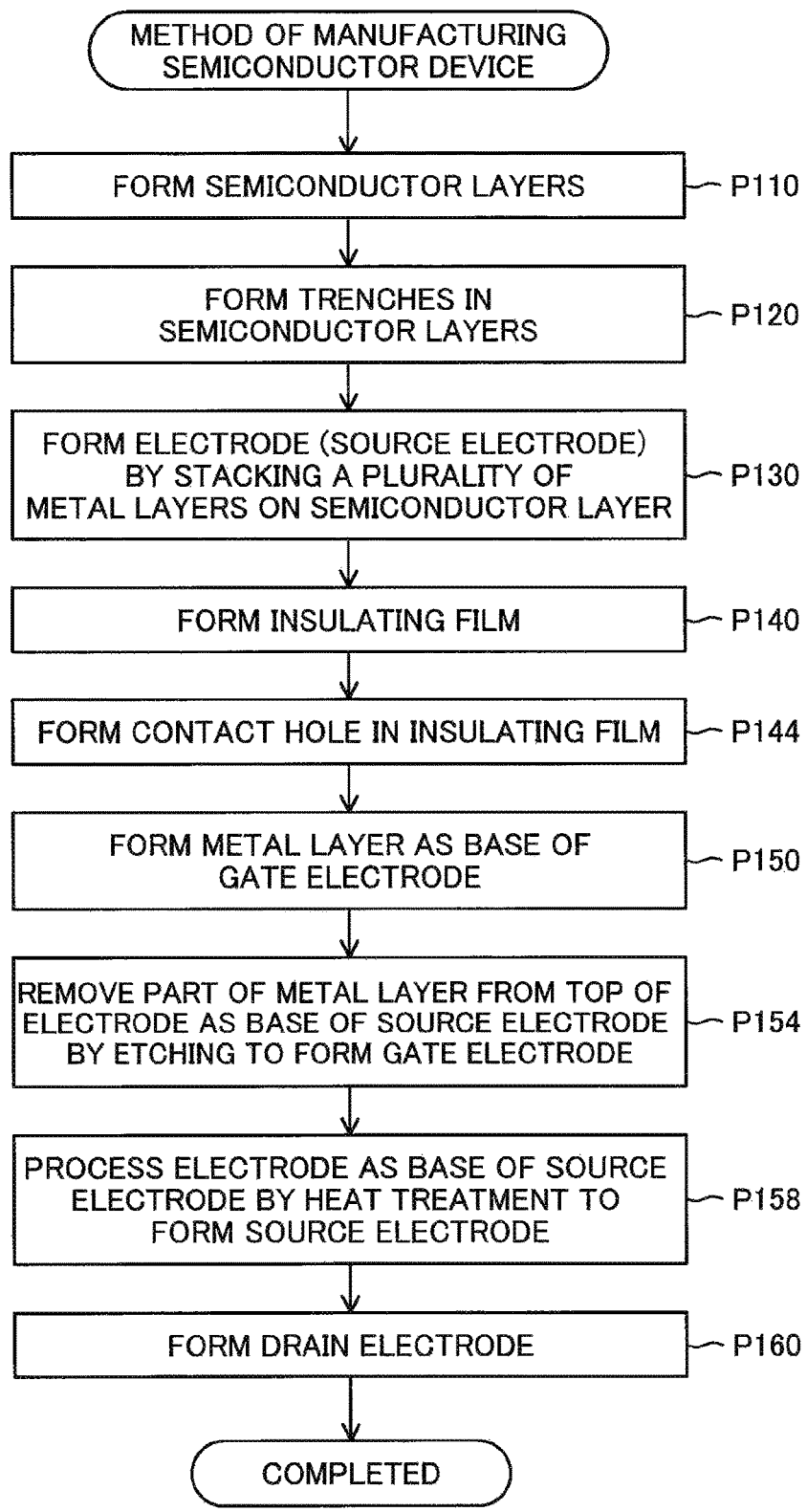
FIG. 3 is a process chart showing a method of manufacturing the semiconductor device 100 according to the first embodiment.

FIG. 3 is a process chart showing a method of manufacturing the semiconductor device 100 according to the first embodiment. The manufacturer first forms the semiconductor layers 112, 114 and 116 (process P110). According to this embodiment, the manufacturer forms the semiconductor layers 112, 114 and 116 by crystal growth.

Figure 4:
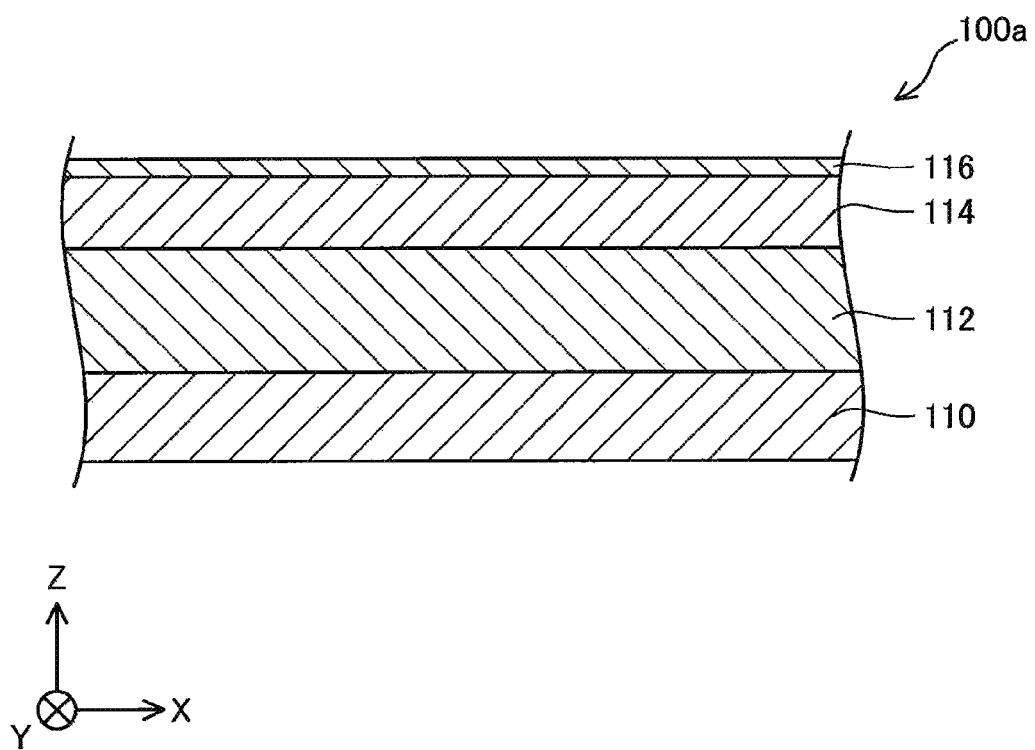
FIG. 4 is a sectional view schematically illustrating the configuration of a semiconductor device 100a in the middle of manufacture (process P110)

FIG. 4 is a sectional view schematically illustrating the configuration of a semiconductor device 100a in the middle of manufacture (process P110). According to this embodiment, the manufacturer forms the semiconductor layer 112 that is the n-type semiconductor layer mainly made of gallium nitride (GaN), on the substrate 110 by metal organic chemical vapor deposition (MOCVD). The manufacturer subsequently forms the semiconductor layer 114 that is the p-type semiconductor layer mainly made of gallium nitride (GaN), on the semiconductor layer 112 by metal organic chemical vapor deposition (MOCVD). The manufacturer then forms the semiconductor layer 116 that is the n-type semiconductor layer mainly made of gallium nitride (GaN), on the semiconductor layer 114 by metal organic chemical vapor deposition (MOCVD). The manufacturer accordingly obtains the semiconductor device 100a that includes the semiconductor layers 112, 114 and 116 formed on the substrate 110.

Referring back to FIG. 3, after forming the semiconductor layers 112, 114 and 116 (process P110), the manufacturer forms the trenches 128 in the semiconductor layers 112, 114 and 116 (process P120). According to this embodiment, the manufacturer forms the trenches 128 in the semiconductor layers 112, 114 and 116 by dry etching.

Figure 5:
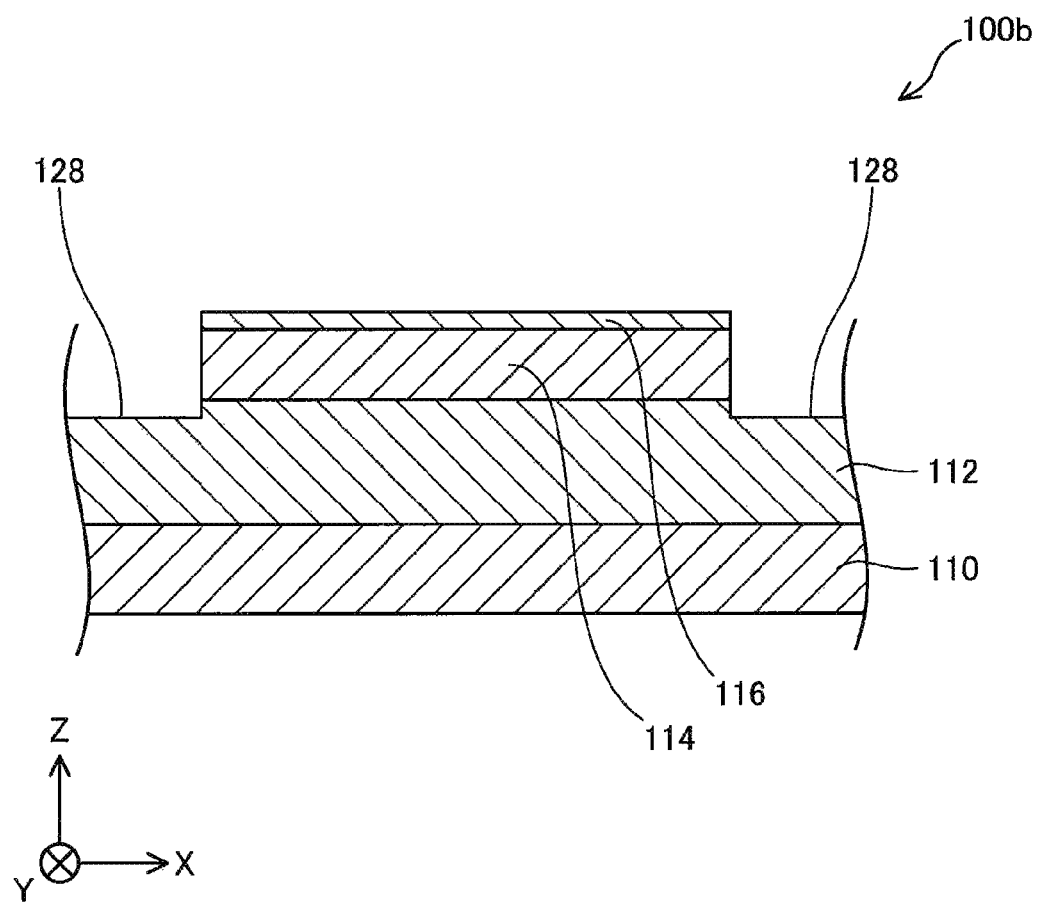
FIG. 5 is a sectional view schematically illustrating the configuration of a semiconductor device 100b in the middle of manufacture (process P120)

FIG. 5 is a sectional view schematically illustrating the configuration of a semiconductor device 100b in the middle of manufacture (process P120). According to this embodiment, the manufacturer forms a mask layer mainly made of silicon dioxide (SiO2) on a +Z-axis direction side surface of the semiconductor layer 116 in the semiconductor device 100a by plasma chemical vapor deposition (CVD). The manufacturer subsequently removes part of the mask layer corresponding to the trenches 128 by photolithography and etching to form a mask pattern from the mask layer. The manufacturer subsequently removes areas of the semiconductor layers 112, 114 and 116 that are exposed on the mask pattern by dry etching using a chlorine-based gas. The manufacturer then removes the mask pattern. The manufacturer accordingly obtains the semiconductor device 100b that includes the trenches 128 formed in the semiconductor layers 112, 114 and 116. According to this embodiment, after forming the trenches 128, the manufacturer processes the semiconductor device 100b by heat treatment to activate the semiconductor layer 114 that is the p-type semiconductor.

Referring back to FIG. 3, after forming the trenches 128 (process P120), the manufacturer forms an electrode 130p as the base of the source electrode 130 on the semiconductor layer 116 (process P130). According to this embodiment, the manufacturer forms the electrode 130p by stacking a plurality of metal layers.

Figure 6:
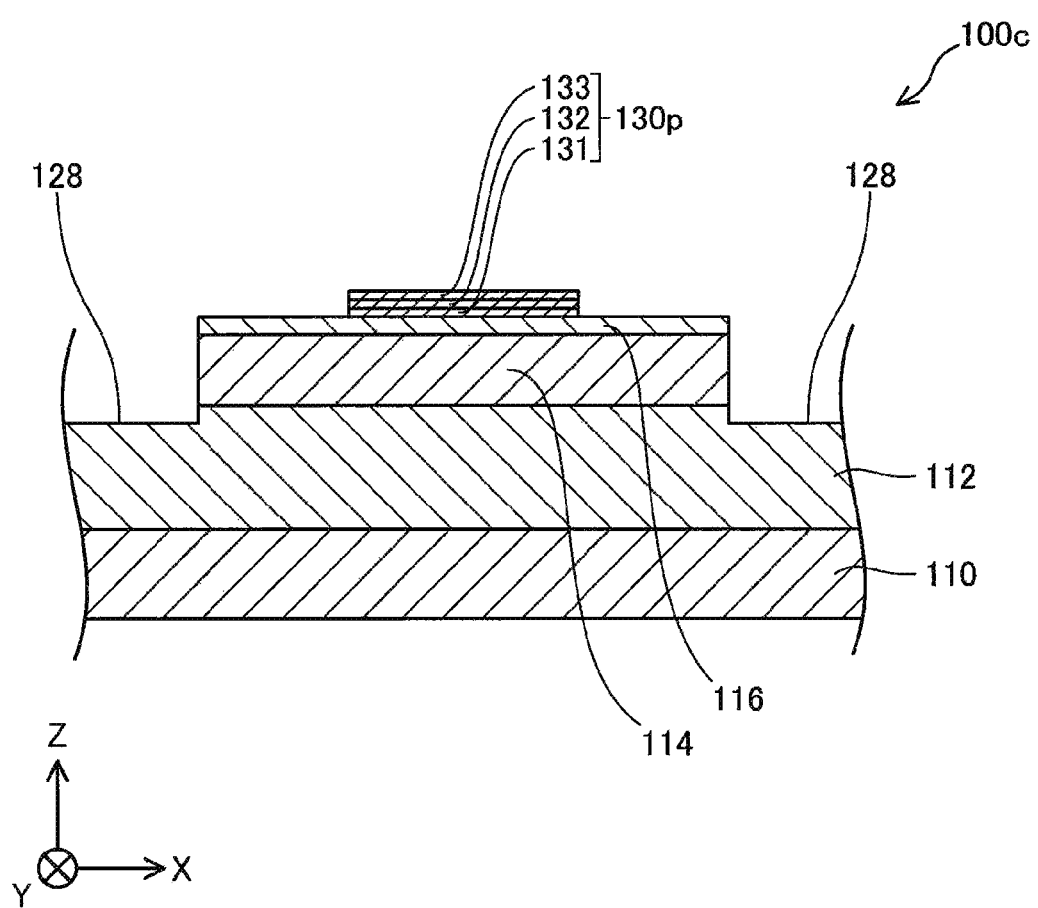
FIG. 6 is a sectional view schematically illustrating the configuration of a semiconductor device 100c in the middle of manufacture (process P130)

FIG. 6 is a sectional view schematically illustrating the configuration of a semiconductor device 100c in the middle of manufacture (process P130). According to this embodiment, the manufacturer uses a photoresist to form a mask pattern that exposes an area of the semiconductor layer 116 where the electrode 130p is to be formed. The manufacturer then forms a metal layer 131 mainly made of titanium (Ti) on the semiconductor layer 116 by vapor deposition. The manufacturer subsequently forms a metal layer 132 mainly made of aluminum (Al) on the metal layer 131 by vapor deposition. The manufacturer subsequently forms a metal layer 133 mainly made of palladium (Pd) on the metal layer 132 by vapor deposition. The manufacturer then removes the mask pattern. The manufacturer accordingly obtains the semiconductor device 100c that includes the electrode 130p formed on the semiconductor layer 116 by this lift-off process.

Referring back to FIG. 3, after forming the electrode 130p (process P130), the manufacturer forms an insulating film 140p as the base of the insulating film 140 (process P140). According to this embodiment, the manufacturer forms the insulating film 140p over the entire +Z-axis direction surface of the semiconductor device 100c.

Figure 7:
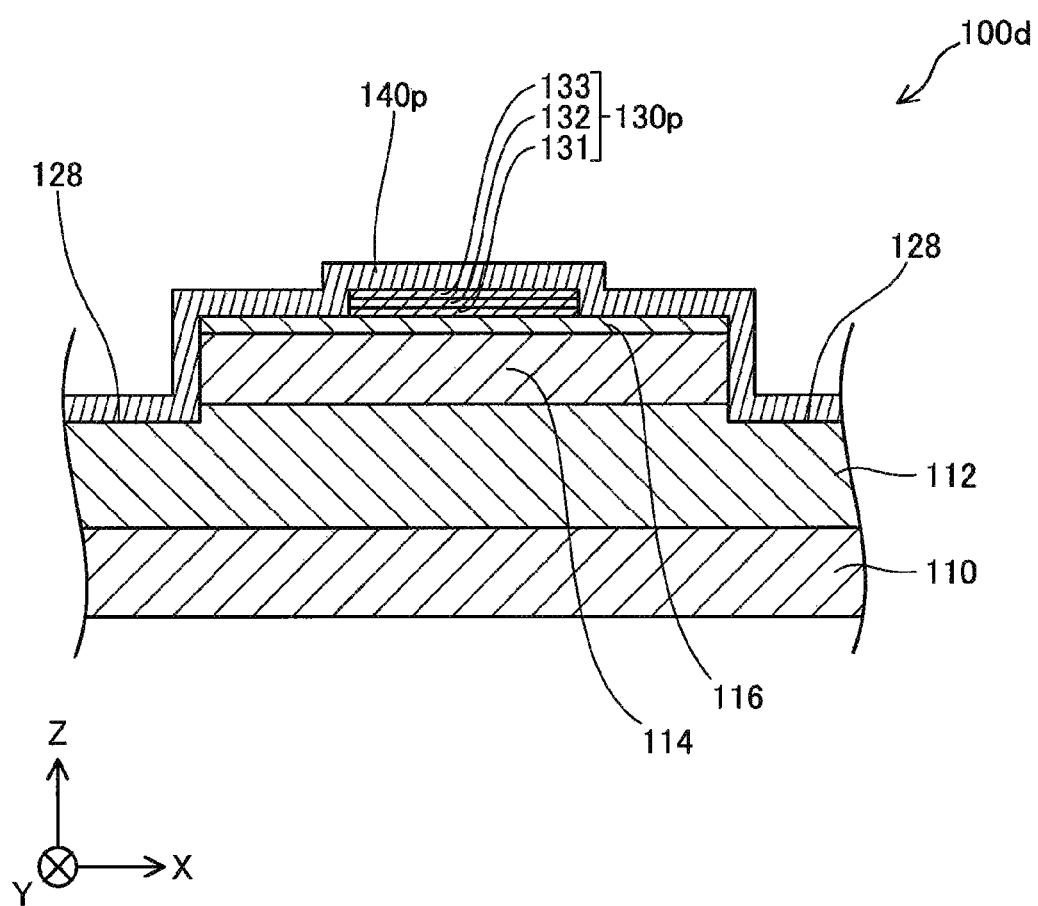
FIG. 7 is a sectional view schematically illustrating the configuration of a semiconductor device 100d in the middle of manufacture (process P140)

FIG. 7 is a sectional view schematically illustrating the configuration of a semiconductor device 100d in the middle of manufacture (process P140). According to this embodiment, the manufacturer forms the insulating film 140p mainly made of silicon dioxide ($SiO_2$) by atomic layer deposition (ALD). The manufacturer accordingly obtains the semiconductor device 100d that includes the insulating film 140p formed over the entire +Z-axis direction side surface.

Referring back to FIG. 3, after forming the insulating film 140p (process P140), the manufacturer forms the contact hole 140h in the insulating film 140p (process P144). According to this embodiment, the manufacturer forms the contact hole 140h in the insulating film 140p by wet etching. The insulating film 140 with the contact hole 140h is accordingly provided from the insulating film 140p.

Figure 8:
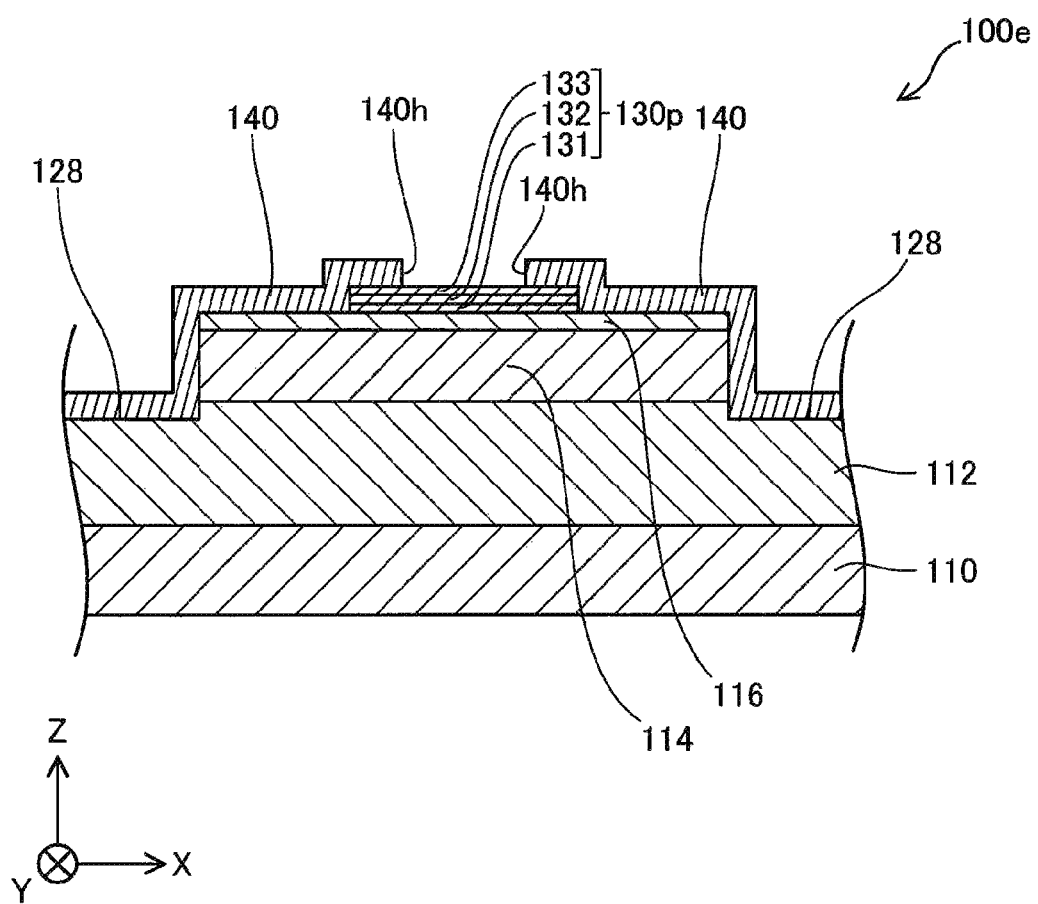
FIG. 8 is a sectional view schematically illustrating the configuration of a semiconductor device 100e in the middle of manufacture (process P144)

FIG. 8 is a sectional view schematically illustrating the configuration of a semiconductor device 100e in the middle of manufacture (process P144). According to this embodiment, the manufacturer removes an area of the insulating film 140p corresponding to the contact hole 140h from top of the electrode 130p by wet etching. The manufacturer accordingly obtains the semiconductor device 100e that includes the insulating film 140 with the contact hole 140h. According to another embodiment, in the case where the contact hole 140h is formed outside of the outer edge of the source electrode 130, the manufacturer may perform the process of forming the insulating film 140p (process P140) and the process of forming the contact hole 140h (process P144) between the process of forming the trench 128 (process P120) and the process of forming the source electrode 130 (process P130).

Referring back to FIG. 3, after forming the contact hole 140h (process P144), the manufacturer forms a metal layer 150p as the base of the gate electrode 150 (process P150). According to this embodiment, the manufacturer forms the metal layer 150p over the entire +Z-axis direction side surface of the semiconductor device 100e.

Figure 9:
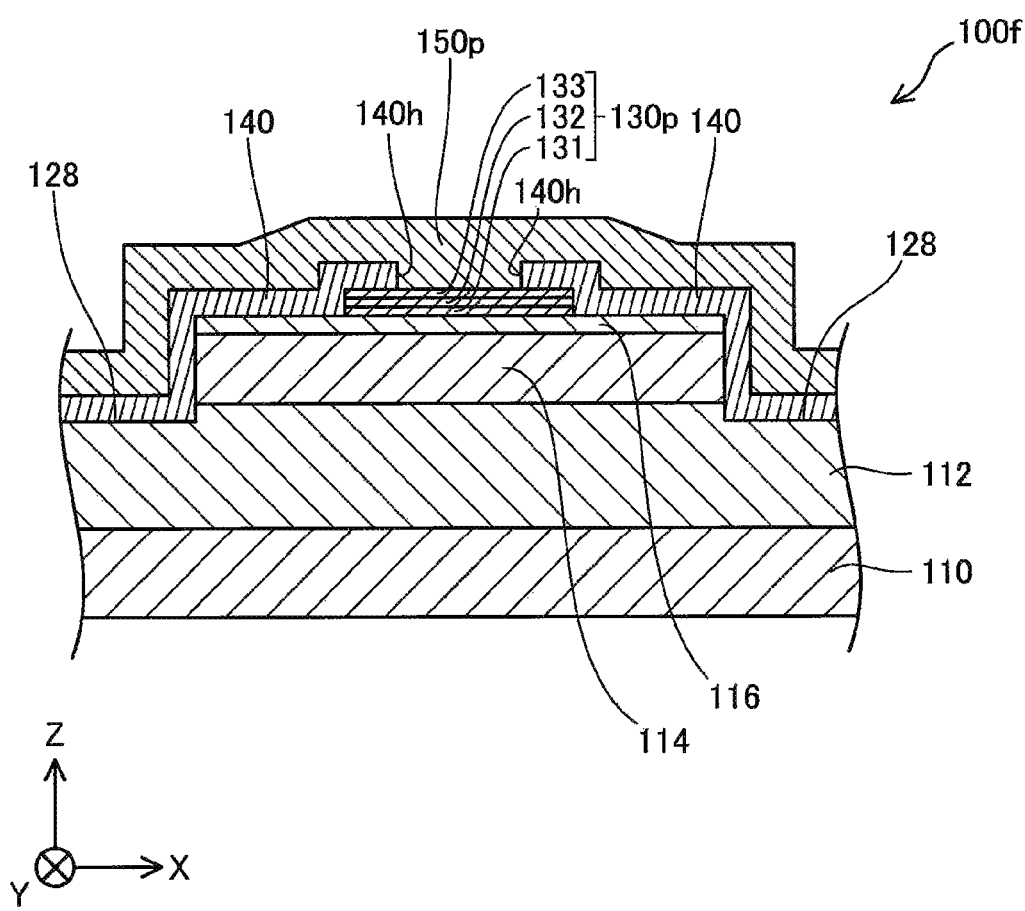
FIG. 9 is a sectional view schematically illustrating the configuration of a semiconductor device 100f in the middle of manufacture (process P150)

FIG. 9 is a sectional view schematically illustrating the configuration of a semiconductor device 100f in the middle of manufacture (process P150). According to this embodiment, the manufacturer forms the metal layer 150p mainly made of aluminum (Al) by sputtering. The manufacturer accordingly obtains the semiconductor device 100f that includes the metal layer 150p formed over the entire +Z-axis direction side surface.

Referring back to FIG. 3, after forming the metal layer 150p (process P150), the manufacturer removes part of the metal layer 150p from top of the electrode 130p that is the base of the source electrode 130 by etching (process P154). In this process, the manufacturer leaves part of the metal layer 150p in a location that is different from top of the electrode 130p but is inside of the trench 128 to form the gate electrode 150. According to this embodiment, the manufacturer forms the gate electrode 150 by chlorine-based dry etching using a chlorine-containing gas. The etching gas used for dry etching may contain at least one of silicon tetrachloride ($SiCl_4$) and boron trichloride ($BCl_3$) as the additive gas. The etching gas used for dry etching may be a gas diluted with at least one of nitrogen gas and argon gas.

Figure 10:
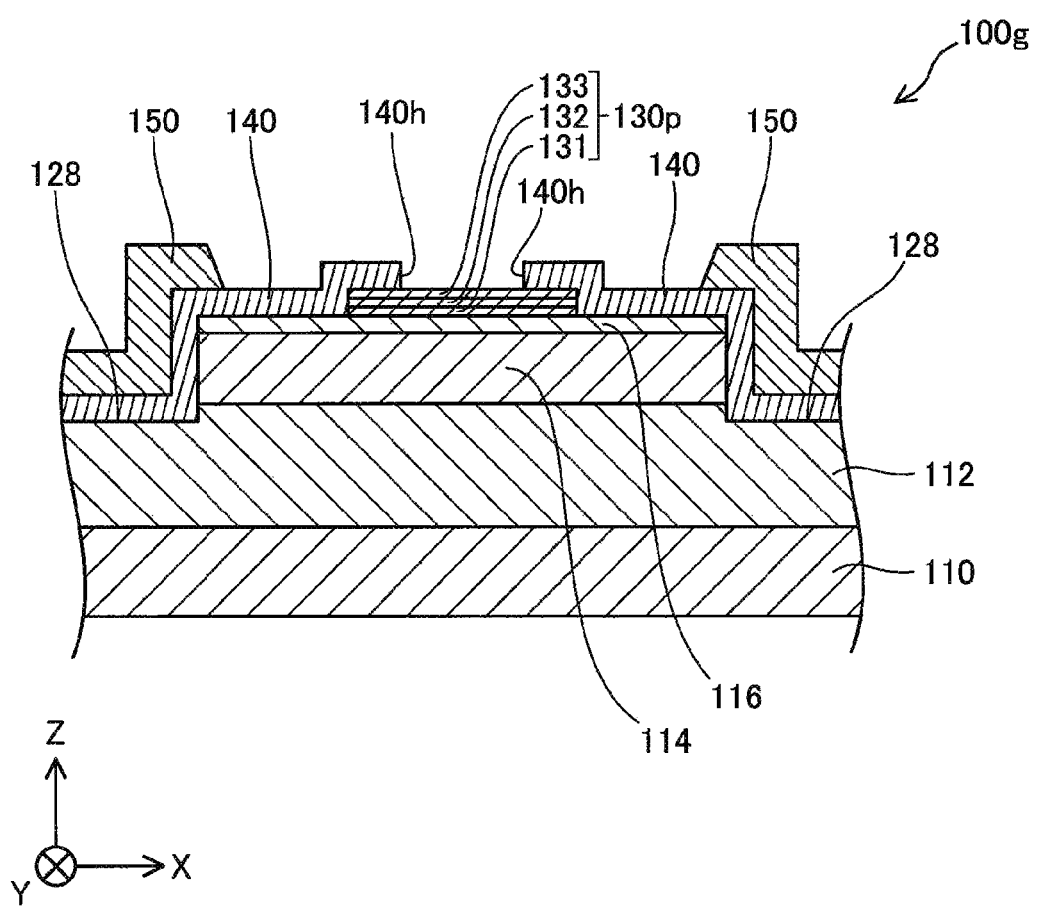
FIG. 10 is a sectional view schematically illustrating the configuration of a semiconductor device 100g in the middle of manufacture (process P154)

FIG. 10 is a sectional view schematically illustrating the configuration of a semiconductor device 100g in the middle of manufacture (process P154). According to this embodiment, the manufacturer uses a photoresist to form a mask pattern corresponding to the gate electrode 150. The manufacturer subsequently removes part of the metal layer 150p from top of the electrode 130p by chlorine-based dry etching. In this process, the metal layer 133 as the outermost layer of the electrode 130p serves as a barrier metal to prevent erosion by etching. After removing part of the metal layer 150p, the manufacturer removes the mask pattern. The manufacturer accordingly obtains the semiconductor device 100g that includes the electrode 130p and the gate electrode 150.

Referring back to FIG. 3, after forming the gate electrode 150 (process P154), the manufacturer processes the electrode 130p as the base of the source electrode 130 by heat treatment (process P158). The source electrode 130 having the lower resistance to the semiconductor layer 116 than the electrode 130p is accordingly provided from the electrode 130p.

Figure 11:
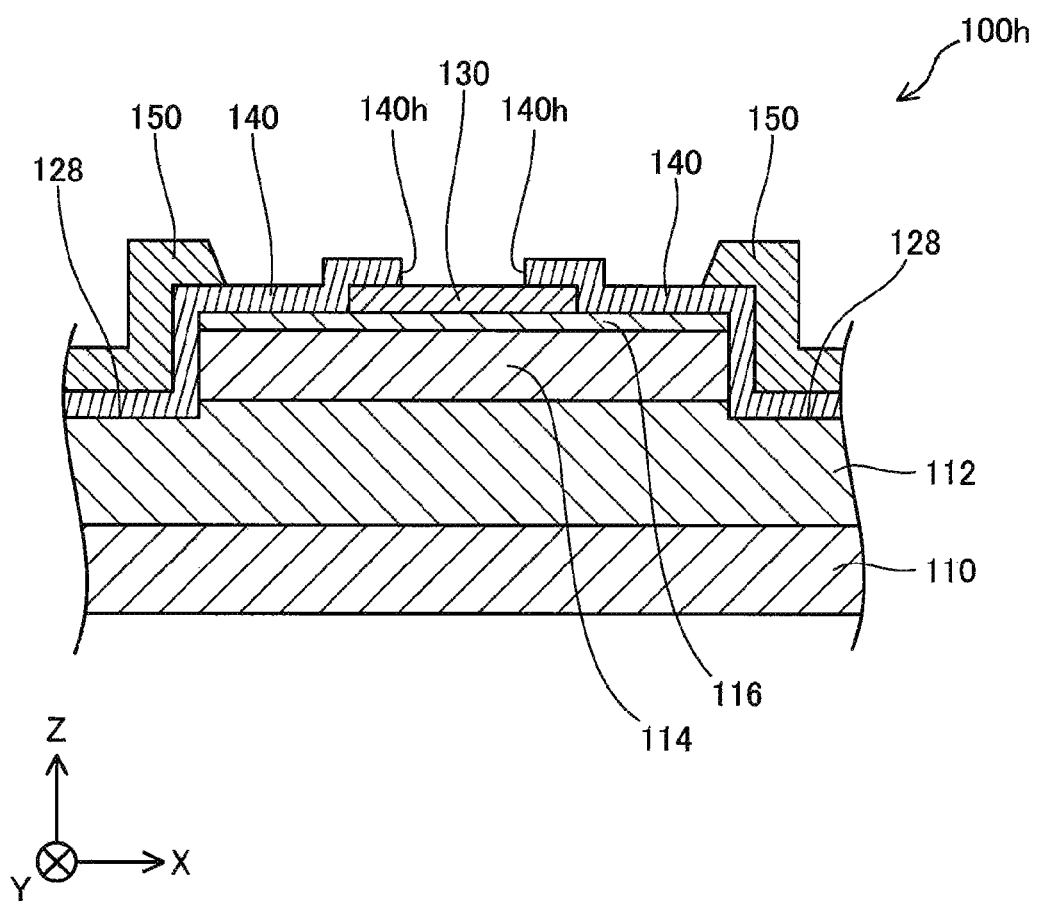
FIG. 11 is a sectional view schematically illustrating the configuration of a semiconductor device 100h in the middle of manufacture (process P158)

FIG. 11 is a sectional view schematically illustrating the configuration of a semiconductor device 100h in the middle of manufacture (process P158). According to this embodiment, the manufacturer processes the electrode 130p by heat treatment at atmospheric temperature of 550° C. using an atmospheric gas mainly made of nitrogen ($N_2$) for five minutes. The manufacturer accordingly obtains the semiconductor device 100h including the source electrode 130 and the gate electrode 150. The time of heat treatment is required to be between 1 minute and 60 minutes. The atmospheric temperature of heat treatment is required to be between 400° C. and 700° C. The atmospheric gas used for heat treatment is not limited to nitrogen ($N_2$) but may be any inert gas.

Referring back to FIG. 3, after forming the source electrode 130 (process P158), the manufacturer forms the drain electrode 160 on the −Z-axis direction side of the substrate 110 (process P160). According to this embodiment, the manufacturer forms a metal layer mainly made of titanium (Ti) on the −Z-axis direction side of the substrate 110 by vapor deposition. The manufacturer subsequently forms a metal layer mainly made of aluminum (Al) on the metal layer mainly made of titanium (Ti) by vapor deposition. The manufacturer then processes these metal layers by heat treatment to form the drain electrode 160. According to another embodiment, the manufacturer may form a metal layer as the base of the drain electrode 160 prior to heat treatment of the electrode 130p (process P158) and then collectively process these metal layers and the electrode 130p by heat treatment (process P158). The semiconductor device 100 is completed by the above series of processes.

A-4. Advantageous Effects

The configuration of the first embodiment described above performs etching (process P154) prior to heat treatment (process P158) to alloy the metals included in the metal layers 131, 132 and 133 of the electrode 130p. This procedure can thus avoid an increase in contact resistance of the source electrode 130 by etching (process P154). More specifically, this can avoid an increase in contact resistance of the source electrode 130 by etching (process P154), while forming the gate electrode 150 by etching (process P154).

B. Second Embodiment

Figure 12:
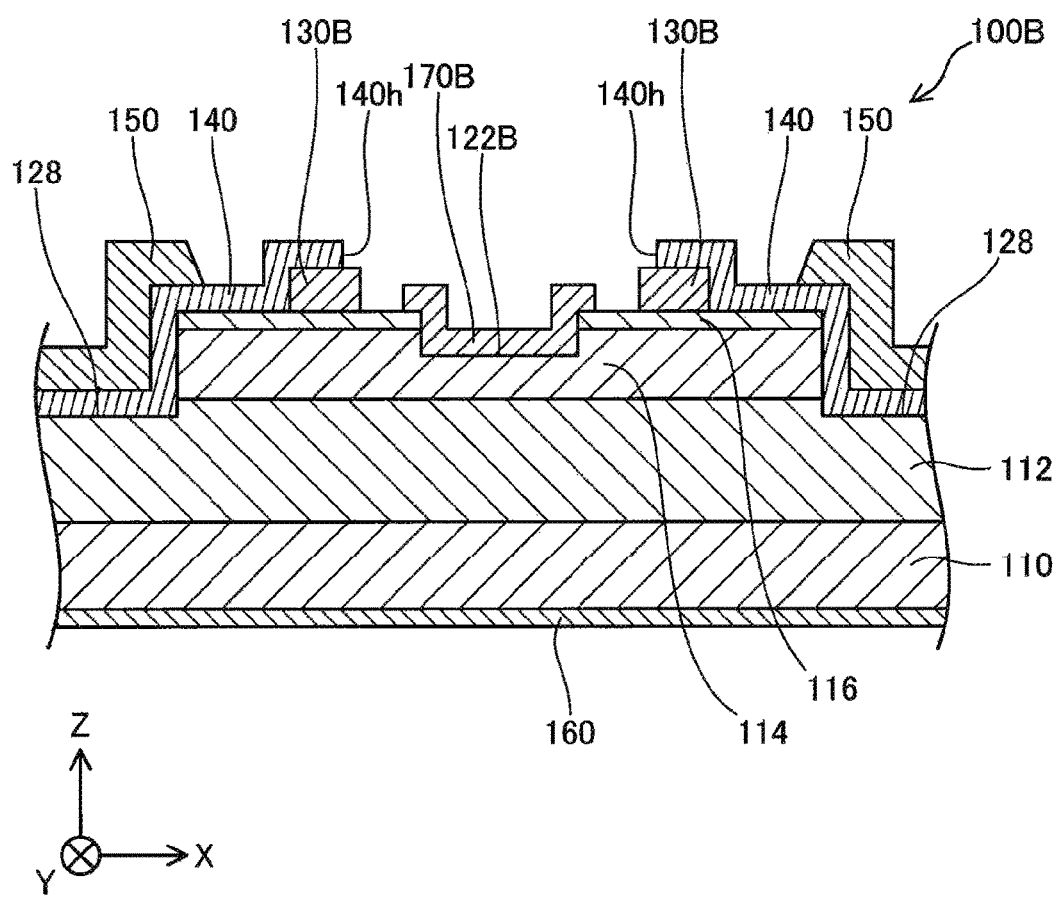
FIG. 12 is a sectional view schematically illustrating the configuration of a semiconductor device 100B according to a second embodiment.

FIG. 12 is a sectional view schematically illustrating the configuration of a semiconductor device 100B according to a second embodiment. The semiconductor device 100B of the second embodiment has configuration similar to that of the semiconductor device 100 of the first embodiment, except that different structures are provided for formation of a body electrode 170B. The semiconductor device 100B includes a recess 122B, a source electrode 130B and the body electrode 170B as structures different from those of of the semiconductor device 100.

The recess 122B of the semiconductor device 100B is a concave that is recessed from the +Z-axis direction side of the semiconductor layer 116 into the semiconductor layer 114. According to this embodiment, the recess 122B is a structure formed by dry etching of the semiconductor layers 114 and 116. According to this embodiment, after forming the semiconductor layers 112, 114 and 116 (process P110), the manufacturer forms the recess 122B prior to forming the trenches 128 (process P120).

The source electrode 130B of the semiconductor device 100B is similar to the source electrode 130 of the first embodiment, except that the source electrode 130B is formed outside of the outer edge of the body electrode 170B.

The body electrode 170B of the semiconductor device 100B is an electrode formed in the recess 122B. The body electrode 170b is in ohmic contact with the semiconductor layer 114. According to this embodiment, the body electrode 170B is an electrode formed by stacking a layer mainly made of palladium (Pd) and subsequently processing the stacked layer by heat treatment. According to this embodiment, after forming the trenches 128 (process P120), the manufacturer forms the body electrode 170B prior to forming the electrode 130p (process P130).

The configuration of the second embodiment described above can avoid an increase in contact resistance of the source electrode 130B by etching (process P154), like the first embodiment.

C. Third Embodiment

Figure 13:
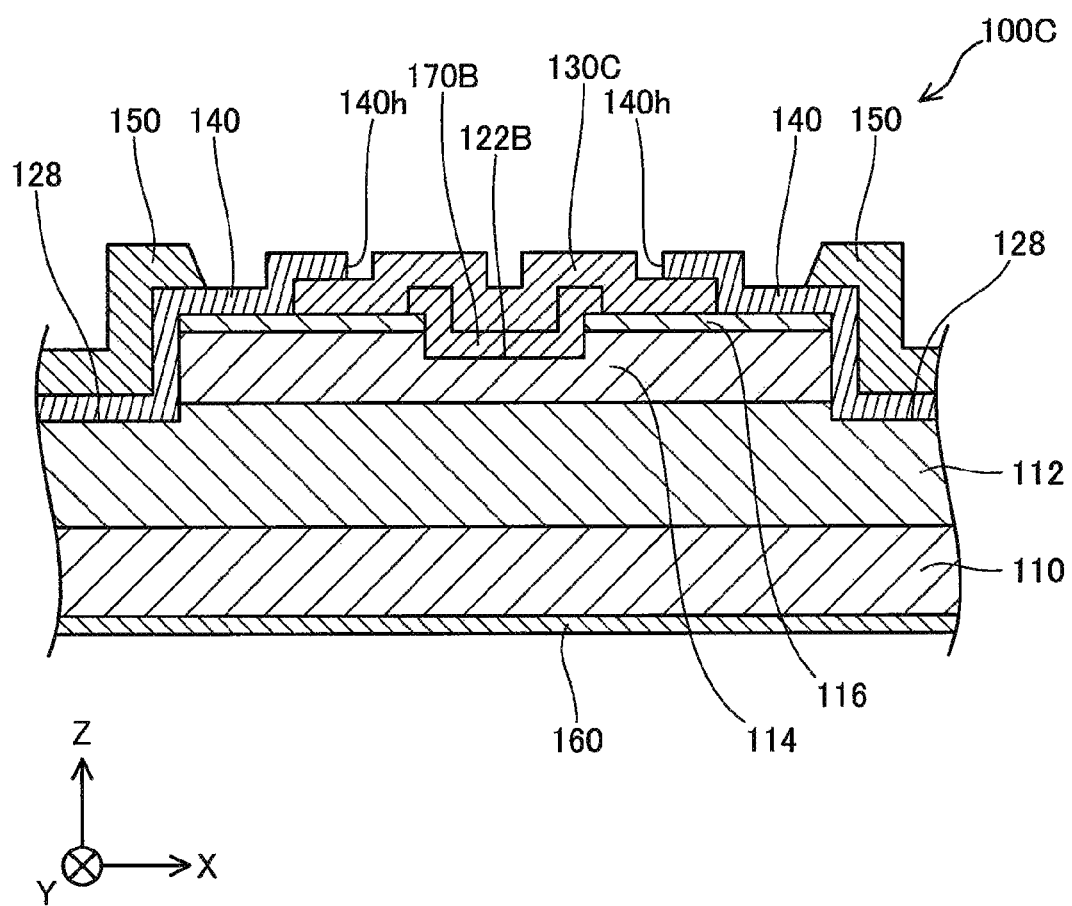
FIG. 13 is a sectional view schematically illustrating the configuration of a semiconductor device 100C according to a third embodiment.

FIG. 13 is a sectional view schematically illustrating the configuration of a semiconductor device 100C according to a third embodiment. The semiconductor device 100C of the third embodiment has configuration similar to that of the semiconductor device 100B of the second embodiment, except that a source electrode 130C is provided in place of the source electrode 130B. The source electrode 130C of the semiconductor device 100C is similar to the source electrode 130B of the second embodiment, except that the source electrode 130C is formed to be extended from top of the semiconductor layer 116 over the body electrode 170B. The configuration of the third embodiment described above can avoid an increase in contact resistance of the source electrode 130C by etching (process P154), like the second embodiment.

D. Fourth Embodiment

Figure 14:
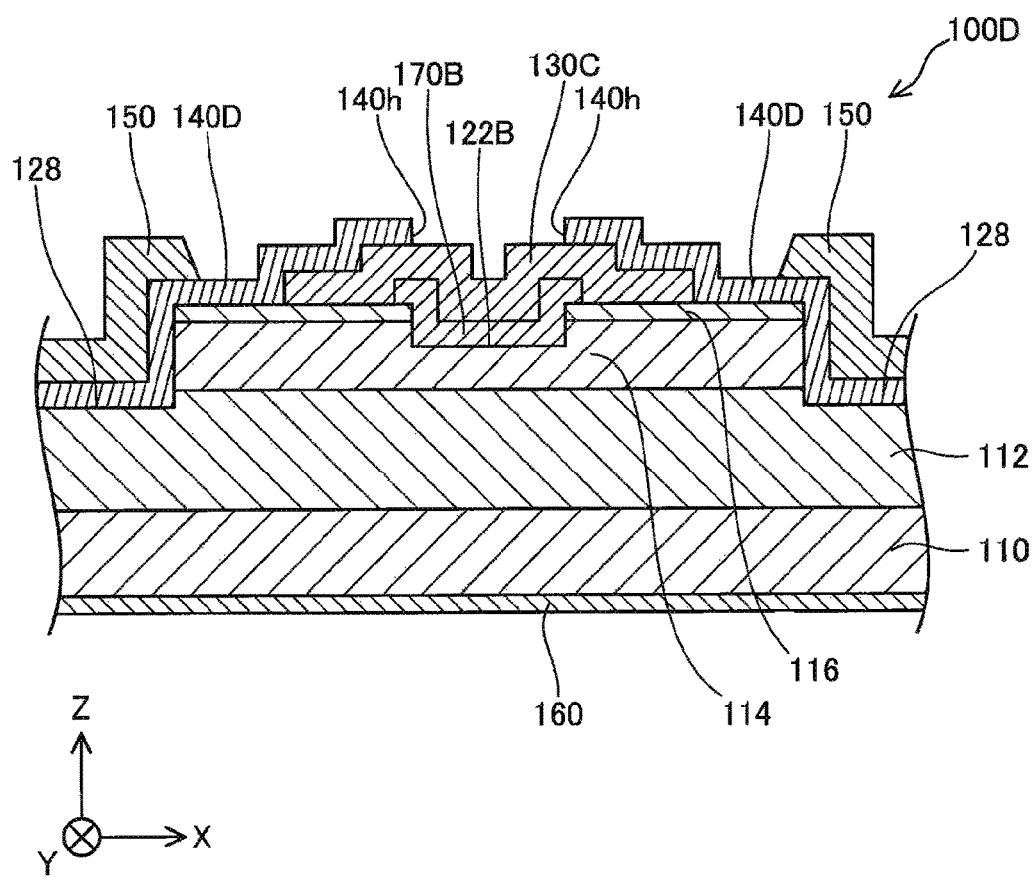
FIG. 14 is a sectional view schematically illustrating the configuration of a semiconductor device 100D according to a fourth embodiment.

FIG. 14 is a sectional view schematically illustrating the configuration of a semiconductor device 100D according to a fourth embodiment. The semiconductor device 100D of the fourth embodiment has configuration similar to that of the semiconductor device 100C of the third embodiment, except that an insulating film 140D is provided in place of the insulating film 140. The insulating film 140D of the semiconductor device 100D is similar to the insulating film 140 of the third embodiment, except that a contact hole 140h is formed inside of the outer edge of the body electrode 170B. The configuration of the fourth embodiment described above can avoid an increase in contact resistance of the source electrode 130C by etching (process P154), like the third embodiment.

E. Fifth Embodiment

Figure 15:
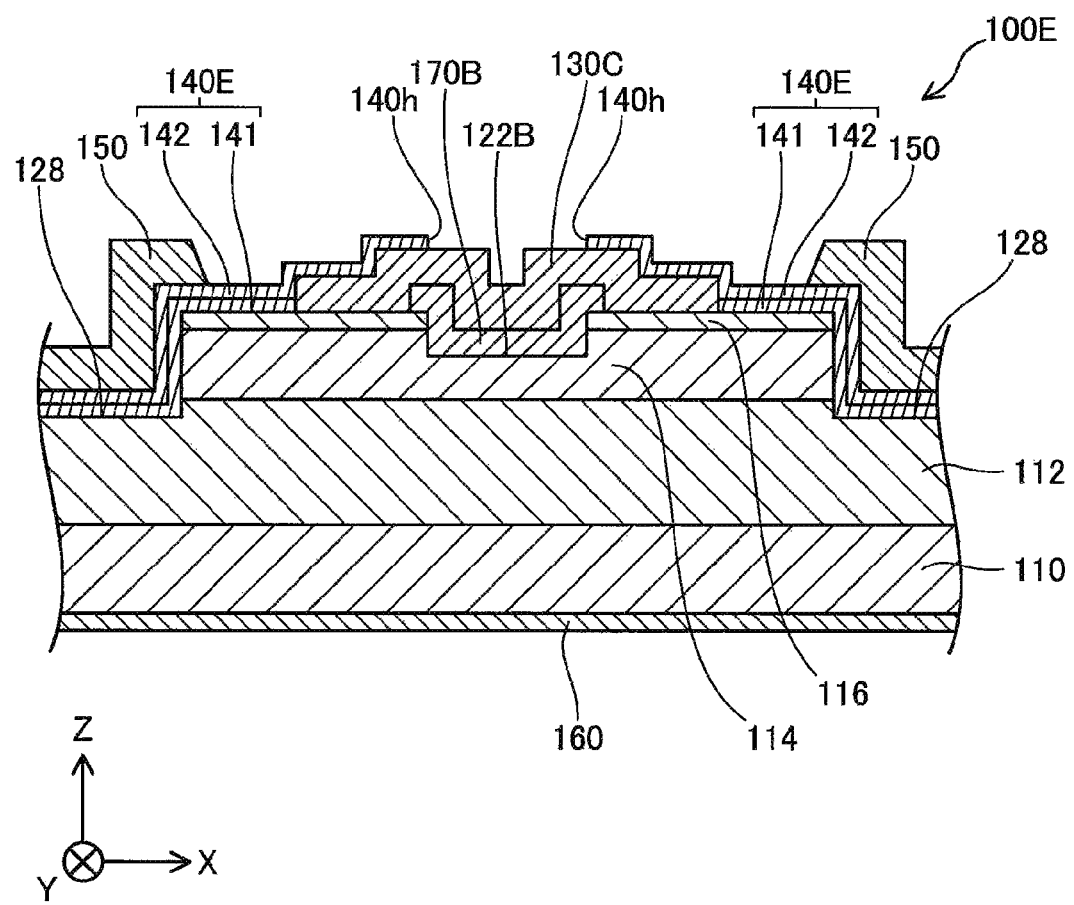
FIG. 15 is a sectional view schematically illustrating the configuration of a semiconductor device 100E according to a fifth embodiment.

FIG. 15 is a sectional view schematically illustrating the configuration of a semiconductor device 100E according to a fifth embodiment. The semiconductor device 100E of the fifth embodiment has configuration similar to that of the semiconductor device 100C of the third embodiment, except that an insulating film 140E is provided in place of the insulating film 140. The insulating film 140E of the semiconductor device 100E has a multi-layered structure consisting of two insulating layers 141 and 142. According to another embodiment, the insulating film 140E may have a multi-layered structure of three or a greater number of insulating layers.

The insulating layer 141 of the insulating film 140E is a first insulating layer formed to be extended from the trench 128 to the outer edge of the source electrode 130C. The insulating layer 142 of the insulating film 140E is a second insulating layer formed to be extended from top of the insulating layer 141 onto the source electrode 130C. The insulating layer 142 has a contact hole 140h formed inside of the outer edge of the body electrode 170.

According to this embodiment, the component of the insulating layer 141 is different from the component of the insulating layer 142. According to this embodiment, the insulating layer 141 is mainly made of silicon dioxide ($SiO_2$), and the insulating layer 142 is mainly made of zirconium oxynitride ($ZrO_xN_y$ ($0.5 \leq x \leq 3$, $0 \leq y \leq 2$)). According to another embodiment, the component of the insulating layer 142 may be identical with the component of the insulating layer 141.

According to this embodiment, the technique employed to form the insulating layer 141 is different from the technique employed to form the insulating layer 142. According to this embodiment, the technique employed to form the insulating layer 141 is atomic layer deposition (ALD), and the technique employed to form the insulating layer 142 is electron cyclotron resonance sputtering (ECR sputtering).

The configuration of the fifth embodiment described above can avoid an increase in contact resistance of the source electrode 130C by etching (process P154), like the third embodiment.

F. Sixth Embodiment

Figure 16:
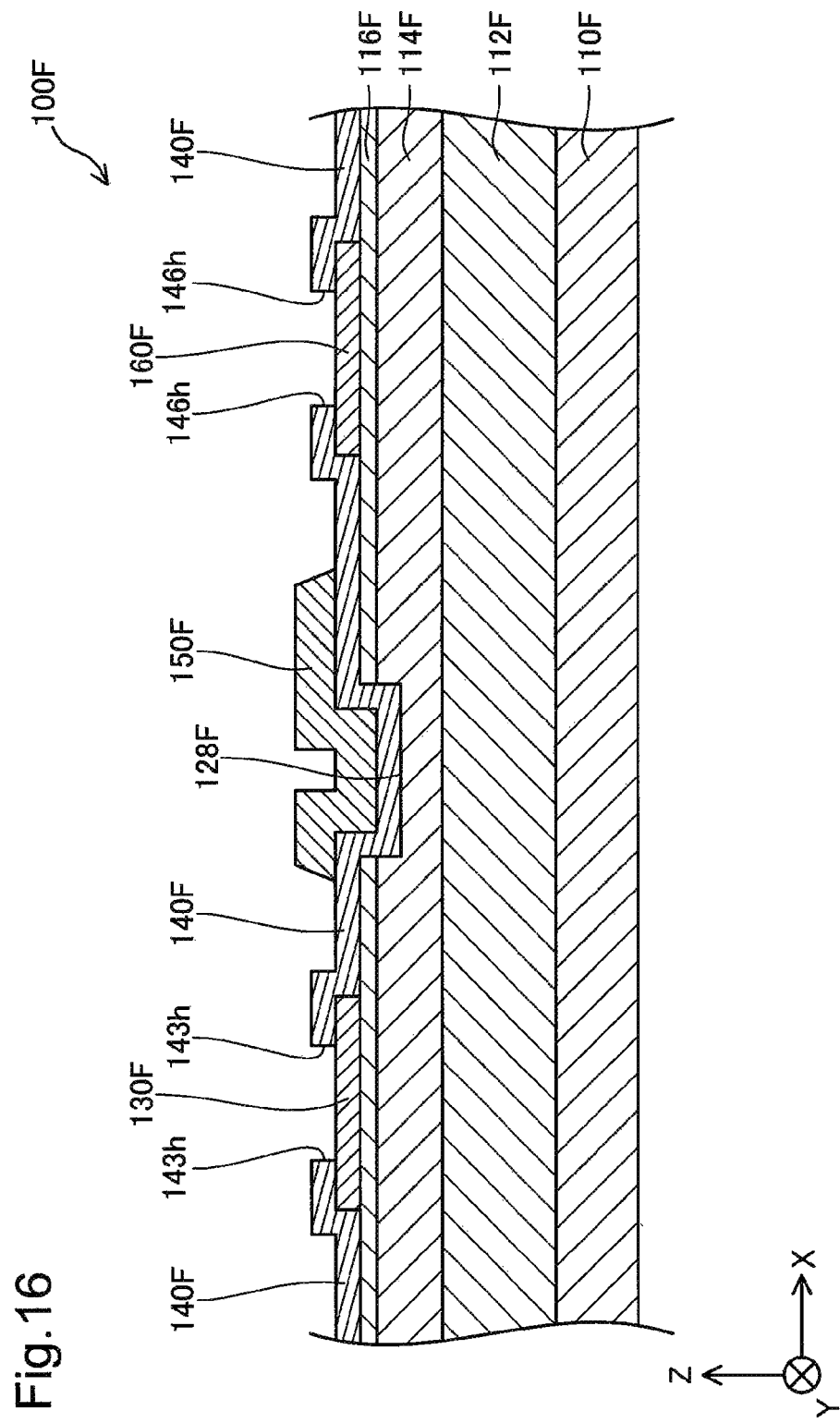
FIG. 16 is a sectional view schematically illustrating the configuration of a semiconductor device 100F according to a sixth embodiment.

FIG. 16 is a sectional view schematically illustrating the configuration of a semiconductor device 100F according to a sixth embodiment. The semiconductor device 100F is a GaN-based semiconductor device. According to this embodiment, the semiconductor device 100F is a lateral MISFET (metal-insulator-semiconductor field effect transistor) having a recess structure.

The semiconductor device 100F includes a substrate 110F, a semiconductor layer 112F, a semiconductor layer 114F and a semiconductor layer 116F. The semiconductor device 100F includes a recess 128F as a structure formed in these semiconductor layers 114F and 116F. The semiconductor device 100F also includes a source electrode 130F, an insulating film 140F, a gate electrode 150F and a drain electrode 160F.

The substrate 110F of the semiconductor device 100F is a plate-like semiconductor extended along the X axis and the Y axis. According to this embodiment, the substrate 110F is mainly made of silicon (Si).

The semiconductor layer 112F of the semiconductor device 100F is a buffer layer that is located on the +Z-axis direction side of the substrate 110F and is extended along the X axis and the Y axis. According to this embodiment, the semiconductor layer 112F has a multi-layered structure formed by stacking a relatively thick undoped layer mainly made of gallium nitride (GaN) on a relatively thin undoped layer mainly made of aluminum nitride (AlN). According to this embodiment, the semiconductor layer 112F is a layer formed on the substrate 110F by metal organic chemical vapor deposition (MOCVD).

The semiconductor layer 114F of the semiconductor device 100F is a carrier transport layer that is located on the +Z-axis direction side of the semiconductor layer 112F and is extended along the X axis and the Y axis. According to this embodiment, the semiconductor layer 114F is an undoped layer mainly made of gallium nitride (GaN). According to this embodiment, the semiconductor layer 114F is a layer formed on the semiconductor layer 112F by metal organic chemical vapor deposition (MOCVD).

The semiconductor layer 116F of the semiconductor device 100F is a barrier layer that is located on the +Z-axis direction side of the semiconductor layer 114F and is extended along the X axis and the Y axis. According to this embodiment, the semiconductor layer 116F is an undoped layer mainly made of aluminum gallium nitride ($Al_{0.25}Ga_{0.75}N$). The semiconductor layer 116F has a wider band gap than that of the semiconductor layer 114F as the carrier transport layer and serves to supply the carrier to the semiconductor layer 114F. A two-dimensional gas is generated on the semiconductor layer 114F-side by the effect of positive polarization charge at a hetero-junction interface between the semiconductor layer 114F and the semiconductor layer 116F. According to this embodiment, the semiconductor layer 116F is a layer formed on the semiconductor layer 114F by metal organic chemical vapor deposition (MOCVD).

The material of the semiconductor layer 116F is not limited to aluminum gallium nitride (AlGaN) but may be another nitride, for example, aluminum indium nitride (AlInN) or aluminum indium gallium nitride (AlGaInN). The semiconductor layer 116F is not limited to the undoped layer but may be a doped layer. The semiconductor layer 116 is not limited to the single-layered structure but may be a multi-layered structure consisting of a plurality of semiconductor layers having difference in at least one of the material and the doping concentration, for example, GaN/AlGaN, InGaN/AlGaN, InGaN/AlGaN/AlN. According to another embodiment, a structure consisting of another barrier layer and another carrier transport layer may be formed on the semiconductor layer 114F and the semiconductor layer 116F.

The recess 128F of the semiconductor device 100F is a concave that is formed to penetrate through the semiconductor layer 116F and to be recessed into the semiconductor layer 114F. According to this embodiment, the recess 128F is a structure formed by dry etching of the semiconductor layers 114F and 116F. The recess 128F has a depth set to sufficiently isolate a two-dimensional electron gas between the source electrode 130F and the gate electrode 150F from a two-dimensional electron gas between the gate electrode 150F and the drain electrode 160F in a state that no gate voltage is applied to the gate electrode 150F. This provides the normally-off state that suppresses the electric current flowing between the source electrode 130F and the drain electrode 160F in the state that no gate voltage is applied to the gate electrode 150F.

The insulating film 140F of the semiconductor device 100F is a film having electrical insulating properties. The insulating film 140F is formed to be extended from the surface of the semiconductor layer 116F and the recess 128F onto the source electrode 130F and the drain electrode 160F. The insulating film 140F has a contact hole 143h formed inside of the outer edge of the source electrode 130F. The insulating film 140F also has a contact hole 146h formed inside of the outer edge of the drain electrode 160F. According to this embodiment, the insulating film 140F is mainly made of silicon dioxide ($SiO_2$). According to this embodiment, the insulating film 140F is a film formed similarly to the insulating film 140 of the first embodiment.

The source electrode 130F of the semiconductor device 100F is an ohmic electrode that is in ohmic contact with the semiconductor layer 116F. The outer periphery of the source electrode 130F is covered with the insulating film 140F. According to this embodiment, the source electrode 130F is an electrode formed similarly to the source electrode 130 of the first embodiment.

The gate electrode 150F of the semiconductor device 100F is an electrode continuously formed over the recess 128F and its periphery via the insulating film 140F. According to this embodiment, the gate electrode 150F is an electrode formed similarly to the gate electrode 150 of the first embodiment.

The drain electrode 160F of the semiconductor device 100F is an ohmic electrode that is in ohmic contact with an area of the semiconductor layer 116F farther from the source electrode 140F than the gate electrode 150F. The outer periphery of the drain electrode 160F is covered with the insulating film 140F. According to this embodiment, the drain electrode 160F is an electrode formed similarly to the source electrode 130F.

The configuration of the sixth embodiment described above can avoid an increase in contact resistance of the source electrode 130F by etching (process P154), like the first embodiment. The configuration of the sixth embodiment can also avoid an increase in contact resistance of the drain electrode 160F by etching (process P154), like the source electrode 130F.

G. Seventh Embodiment

Figure 17:
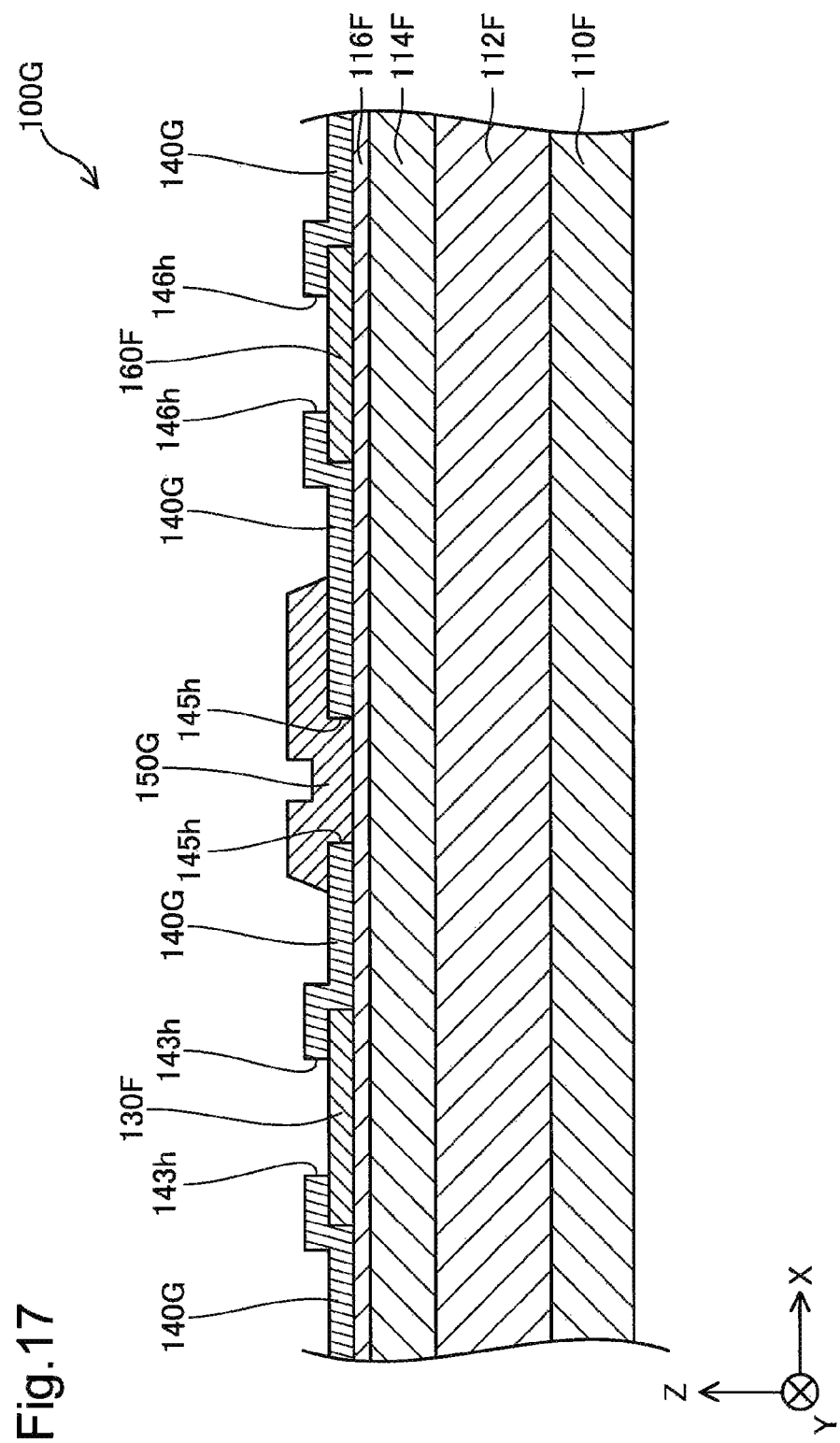
FIG. 17 is a sectional view schematically illustrating the configuration of a semiconductor device 100G according to a seventh embodiment.

FIG. 17 is a sectional view schematically illustrating the configuration of a semiconductor device 100G according to a seventh embodiment. According to this embodiment, the semiconductor device 100G is a lateral HFET (heterostructure field effect transistor).

The semiconductor device 100G of the seventh embodiment has configuration similar to the semiconductor device 100F of the sixth embodiment, except that the recess 128F is not formed, that an insulating film 140G is provided in place of the insulating film 140F and that a gate electrode 150G is provided in place of the gate electrode 150F.

The insulating film 140G of the semiconductor device 100G is similar to the insulating film 140F of the sixth embodiment, except that the insulating film 140G is formed from the surface of the semiconductor layer 116F onto the source electrode 130F and the drain electrode 160F and that a contact hole 145h is provided between the source electrode 130F and the drain electrode 160F.

The gate electrode 150G of the semiconductor device 100G is similar to the gate electrode 150F of the sixth embodiment, except that the gate electrode 150G is formed on the semiconductor layer 116F through the contact hole 145h of the insulating film 140G and is formed from top of the semiconductor layer 116F onto the insulating film 140G.

The configuration of the seventh embodiment described above can avoid an increase in contact resistance of the source electrode 130F by etching (process P154), like the sixth embodiment. The configuration of the seventh embodiment can also avoid an increase in contact resistance of the drain electrode 160F by etching (process P154), like the source electrode 130F.

H. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the present invention is applied to is not limited to the vertical trench MOSFET, the lateral MISFET or lateral HFET described in the above embodiments but may be, for example, an insulated gate bipolar transistor (IGBT).

In the embodiments described above, the material of the substrate is not limited to gallium nitride (GaN) but may be any of silicon (Si), sapphire ($Al_2O_3$) and silicon carbide (SiC). In the embodiments described above, the material of each semiconductor layer is not limited to gallium nitride (GaN) but may be any of silicon (Si), silicon carbide (SiC), nitride semiconductors, diamond, gallium oxide ($Ga_2O_3$), gallium arsenide (GaAs) and indium phosphide (InP).

In the embodiments described above, the donor element contained in the n-type semiconductor layer is not limited to silicon (Si) but may be germanium (Ge) or oxygen (O).

In the embodiments described above, the acceptor element contained in the p-type semiconductor layer is not limited to magnesium (Mg) but may be zinc (Zn) or carbon (C).

In the embodiments described above, the material of the insulating film may be any material having electrical insulating properties, for example, at least one of silicon dioxide ($SiO_2$), silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulating film may have a single-layered structure or may have a two-layered or multi-layered structure. The technique employed to form the insulating film is not limited to ALD but may be another technique such as ECR sputtering or plasma CVD.

In the embodiments described above, the materials of the respective electrodes are not limited to the materials described above but may be other suitable materials. For example, the metal layer 131 may be a metal layer mainly made of at least one metal or alloy among titanium (Ti), vanadium (V) and their alloys. This sufficiently reduces the contact resistance of the electrode. The metal layer 132 may be a metal layer mainly made of aluminum (Al) or an aluminum (Al)-containing alloy. This enhances the ohmic properties of the ohmic electrode. The metal layer 133 may be a metal layer mainly made of at least one metal or alloy among palladium (Pd), gold (Au), platinum (Pt) and their alloys. This enhances the resistance of the metal layer 133 to etching.

What is claimed is:

1. A method of manufacturing a semiconductor device, the method comprising:
    forming a semiconductor layer;
    forming an ohmic electrode, by stacking a plurality of metal layers, on the semiconductor layer;
    forming another metal layer that mainly comprises another metal, different from a material of an outermost layer among the plurality of metal layers, on the ohmic electrode;
    removing the another metal layer from a top of the ohmic electrode by an etching; and
    processing the ohmic electrode by a heat treatment, subsequent to the etching,
    wherein the removing the another metal layer from the top of the ohmic electrode by etching comprises leaving a part of the another metal layer in an area different from the top of the ohmic electrode to form another electrode different from the ohmic electrode.

2. The method of manufacturing the semiconductor device according to claim 1, wherein the etching includes a dry etching.

3. The method of manufacturing the semiconductor device according to claim 2, wherein the dry etching uses a chlorine-containing gas.

4. The method of manufacturing the semiconductor device according to claim 1, wherein the forming the ohmic electrode on the semiconductor layer comprises forming a metal layer mainly comprising at least one metal or an alloy selected from a group consisting of titanium (Ti), vanadium (V) and alloys thereof, as a metal layer formed on the semiconductor layer among the plurality of metal layers.

5. The method of manufacturing the semiconductor device according to claim 1, wherein the forming the ohmic electrode on the semiconductor layer comprises forming a metal layer mainly comprising aluminum (Al) or an aluminum (Al)-containing alloy, as a metal layer different from the outermost layer among the plurality of metal layers.

6. The method of manufacturing the semiconductor device according to claim 1, wherein the forming the ohmic electrode on the semiconductor layer comprises forming a metal layer mainly comprising at least one metal or an alloy selected from a group consisting of palladium (Pd), gold (Au), platinum (Pt) and alloys thereof, as the outermost layer.

7. The method of manufacturing the semiconductor device according to claim 1, wherein the forming the another metal layer comprises forming a metal layer mainly comprising aluminum (Al) or an aluminum (Al)-containing alloy, as at least the part of the another metal layer.

8. The method of manufacturing the semiconductor device according to claim 1, wherein the processing the ohmic electrode by the heat treatment comprises processing the ohmic electrode by the heat treatment for a time period between 1 minute and 60 minutes, inclusive.

9. The method of manufacturing the semiconductor device according to claim 1, wherein the processing the ohmic electrode by the heat treatment comprises processing the ohmic electrode by the heat treatment in an atmospheric temperature of between 400° C. and 700° C., inclusive.

10. The method of manufacturing the semiconductor device according to claim 1, wherein the processing the ohmic electrode by the heat treatment comprises processing the ohmic electrode by the heat treatment using an atmospheric gas mainly comprising nitrogen ($N_2$).

11. The method of manufacturing the semiconductor device according to claim 1, wherein the semiconductor layer mainly comprises gallium nitride (GaN).

12. A semiconductor device manufactured by the method of manufacturing the semiconductor device according to claims 1.

13. A power converter comprising the semiconductor device according to claim 12.

* * * * *